(12) United States Patent
Okumura et al.

(10) Patent No.: US 10,204,891 B2
(45) Date of Patent: *Feb. 12, 2019

(54) SEMICONDUCTOR MODULE

(71) Applicant: Kabushiki Kaisha Toshiba, Minato-ku (JP)

(72) Inventors: Naohisa Okumura, Kanagawa (JP); Daijo Chida, Kanagawa (JP); Hiroaki Kishi, Kanagawa (JP); Isao Ogawa, Oita (JP); Masaru Koseki, Fukuoka (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 109 days.

This patent is subject to a terminal disclaimer.

(21) Appl. No.: 15/460,568

(22) Filed: Mar. 16, 2017

(65) Prior Publication Data

US 2017/0186738 A1  Jun. 29, 2017

Related U.S. Application Data

(63) Continuation of application No. 15/061,397, filed on Mar. 4, 2016, now Pat. No. 9,633,984.

(30) Foreign Application Priority Data

Mar. 13, 2015 (JP) .................. 2015-050852

(51) Int. Cl.
*H01L 25/16* (2006.01)
*H01L 23/00* (2006.01)
(Continued)

(52) U.S. Cl.
CPC ........... *H01L 25/167* (2013.01); *H01L 24/48* (2013.01); *H01L 25/50* (2013.01); *H01L 31/14* (2013.01);
(Continued)

(58) Field of Classification Search
CPC ..................................... H01L 25/167
See application file for complete search history.

(56) References Cited

U.S. PATENT DOCUMENTS 3,914,137 A * 10/1975 Huffman ................. H01L 27/15
148/DIG. 135
5,049,527 A * 9/1991 Merrick ................. H01L 31/167
174/529

(Continued)

FOREIGN PATENT DOCUMENTS

JP  52-57789      5/1977
JP  52-74764 U    6/1977

(Continued)

OTHER PUBLICATIONS

Japanese Office Action dated Nov. 24, 2017 in Japanese Patent Application No. 2015-050852, 5 pages.

Primary Examiner — Evren Seven
(74) Attorney, Agent, or Firm — Oblon, McClelland, Maier & Neustadt, L.L.P.

(57) ABSTRACT

According to one embodiment, a semiconductor module includes a first semiconductor element, a second semiconductor element, a first light emitting element and a second light emitting element. The first semiconductor element is provided with a first light receiving circuit and a first output circuit. The second semiconductor element is provided with a second light receiving circuit and a second output circuit. The first light emitting element is electrically connected to the second output circuit and mounted on the first semiconductor element such that first light emitted from the first light emitting element is received by the first light receiving circuit. The second light emitting element is electrically connected to the first output circuit and mounted on the second semiconductor element such that second light emit-
(Continued)

ted from the second light emitting element is received by the second light receiving circuit.

7 Claims, 10 Drawing Sheets

(51) Int. Cl.
    *H01L 25/00*     (2006.01)
    *H01L 31/14*     (2006.01)
    *H01L 31/16*     (2006.01)

(52) U.S. Cl.
    CPC .............. *H01L 31/16* (2013.01); *H01L 24/49* (2013.01); *H01L 2224/05554* (2013.01); *H01L 2224/48091* (2013.01); *H01L 2224/48137* (2013.01); *H01L 2224/48247* (2013.01); *H01L 2224/49171* (2013.01); *H01L 2224/73265* (2013.01); *H01L 2224/8592* (2013.01); *H01L 2924/00014* (2013.01); *H01L 2924/181* (2013.01)

(56) References Cited

U.S. PATENT DOCUMENTS

| | | | | |
|---|---|---|---|---|
| 5,475,376 | A * | 12/1995 | Chikamitue | E05G 1/08 340/5.73 |
| 6,522,254 | B1 * | 2/2003 | Yamano | G08B 17/107 250/574 |
| 6,943,378 | B2 * | 9/2005 | Kek | H01L 25/167 257/79 |
| 7,235,804 | B2 * | 6/2007 | Aki | H01L 27/15 250/551 |
| 7,485,841 | B2 * | 2/2009 | Inoue | G01V 8/20 250/221 |
| 8,232,580 | B2 * | 7/2012 | Nozaki | H01L 27/1443 257/184 |
| 8,410,493 | B2 * | 4/2013 | Nakashiba | H01L 23/50 257/80 |
| 8,415,681 | B2 * | 4/2013 | Takada | H01L 33/486 257/100 |
| 9,006,759 | B2 * | 4/2015 | Miyashita | H01L 25/0753 257/432 |
| 9,033,592 | B2 * | 5/2015 | Arao | G02B 6/43 385/59 |
| 9,066,431 | B2 * | 6/2015 | Liu | H05K 1/09 |
| 9,077,352 | B2 * | 7/2015 | Uo | H03L 7/183 |
| 9,171,969 | B2 * | 10/2015 | Yamamoto | H01L 31/02005 |
| 9,318,665 | B2 * | 4/2016 | Yamada | F21S 4/24 |
| 9,379,288 | B2 * | 6/2016 | Choi | H01L 33/20 |
| 9,633,984 | B2 * | 4/2017 | Okumura | H01L 25/167 |
| 2002/0063301 | A1 * | 5/2002 | Hanamoto | H01L 33/502 257/432 |
| 2003/0116773 | A1 * | 6/2003 | Kraus | H01L 31/12 257/88 |
| 2003/0168720 | A1 * | 9/2003 | Kamada | B29C 45/14655 257/666 |
| 2004/0041246 | A1 * | 3/2004 | Loh | H01L 25/167 257/678 |
| 2006/0113838 | A1 * | 6/2006 | Iwagami | H02M 1/088 307/1 |
| 2006/0220747 | A1 * | 10/2006 | Kiji | H03F 3/08 330/308 |
| 2006/0262483 | A1 * | 11/2006 | Osame | G02F 1/133345 361/500 |
| 2007/0182323 | A1 * | 8/2007 | Ogata | H01L 33/56 313/512 |
| 2008/0054169 | A1 * | 3/2008 | Okada | G01D 5/34715 250/231.13 |
| 2009/0174048 | A1 * | 7/2009 | Liu | H01L 23/49575 257/676 |
| 2009/0290386 | A1 * | 11/2009 | Ikeda | H02M 3/33523 363/19 |
| 2011/0115055 | A1 * | 5/2011 | Niide | H01L 25/167 257/603 |
| 2012/0057832 | A1 * | 3/2012 | Sun | G02B 6/4292 385/88 |
| 2012/0162947 | A1 * | 6/2012 | O'Donnell | H01L 25/16 361/783 |
| 2012/0280344 | A1 * | 11/2012 | Shastri | G02B 6/426 257/432 |
| 2012/0326170 | A1 * | 12/2012 | Liu | H01L 25/167 257/82 |
| 2013/0030729 | A1 * | 1/2013 | Tu | G06F 11/2215 702/58 |
| 2013/0039648 | A1 * | 2/2013 | Uo | H04B 10/802 398/25 |
| 2013/0119427 | A1 * | 5/2013 | Zhang | H01L 33/38 257/99 |
| 2013/0161662 | A1 * | 6/2013 | Imai | H01L 33/48 257/88 |
| 2013/0168531 | A1 * | 7/2013 | Wong | G01J 1/4257 250/201.1 |
| 2013/0293810 | A1 * | 11/2013 | Ke | F21V 9/10 349/65 |
| 2013/0315533 | A1 * | 11/2013 | Tay | H01L 31/16 385/31 |
| 2014/0084305 | A1 * | 3/2014 | Fujimoto | H01L 31/173 257/82 |
| 2016/0035942 | A1 * | 2/2016 | Hsing Chen | H01L 25/0753 257/88 |
| 2016/0073466 | A1 * | 3/2016 | Tsunetsugu | H05B 33/0854 315/149 |
| 2016/0190352 | A1 * | 6/2016 | Tsukagoshi | H01L 31/0203 257/432 |
| 2016/0260862 | A1 * | 9/2016 | Kugiyama | H01L 31/0203 |
| 2017/0040305 | A1 * | 2/2017 | Kugiyama | H01L 31/167 |
| 2018/0114804 | A1 * | 4/2018 | Hsieh | H01L 27/14643 |
| 2018/0190628 | A1 * | 7/2018 | Male | H01F 38/14 |

FOREIGN PATENT DOCUMENTS

| | | |
|---|---|---|
| JP | 55-7386 U | 1/1980 |
| JP | 4-69059 | 3/1992 |
| JP | 5-82059 U | 11/1993 |
| JP | 6-45636 A | 2/1994 |
| JP | 2008-42126 | 2/2008 |
| JP | 2009-284618 | 12/2009 |
| JP | 2013098471 A * | 5/2013 |
| JP | 2014-63927 A | 4/2014 |
| JP | 2014-187210 A | 10/2014 |

\* cited by examiner

SEMICONDUCTOR MODULE

CROSS REFERENCE TO RELATED APPLICATION

This application is a continuation of U.S. application Ser. No. 15/061,397, filed Mar. 4, 2016, which is based upon and claims the benefit of priority from the prior Japanese Patent Application No. 2015-050852, filed on Mar. 13, 2015, the entire contents of which are incorporated herein by reference.

FIELD

The embodiments described herein generally relates to a semiconductor module.

BACKGROUND

In general, a primary circuit operated at a low operating voltage and a secondary circuit operated at a high operating voltage exchange signals via insulating elements for the purpose of ensuring the safety or other purposes.

For example, in a gate driver which drives a power semiconductor element such as an IGBT or a MOSFET used for an inverter which converts direct current to alternating current, a signal to turn on and off the gate of the power semiconductor element is transmitted from the primary circuit to the secondary circuit via a photocoupler.

Meanwhile, the signals related to the operating conditions of the power semiconductor are transmitted from the secondary circuit to the primary circuit via a photocoupler.

However, these photocouplers are externally mounted one on the primary circuit and the other on the secondary circuit, and this makes it difficult to downsize the gate driver.

DETAILED DESCRIPTION

Figure 1:
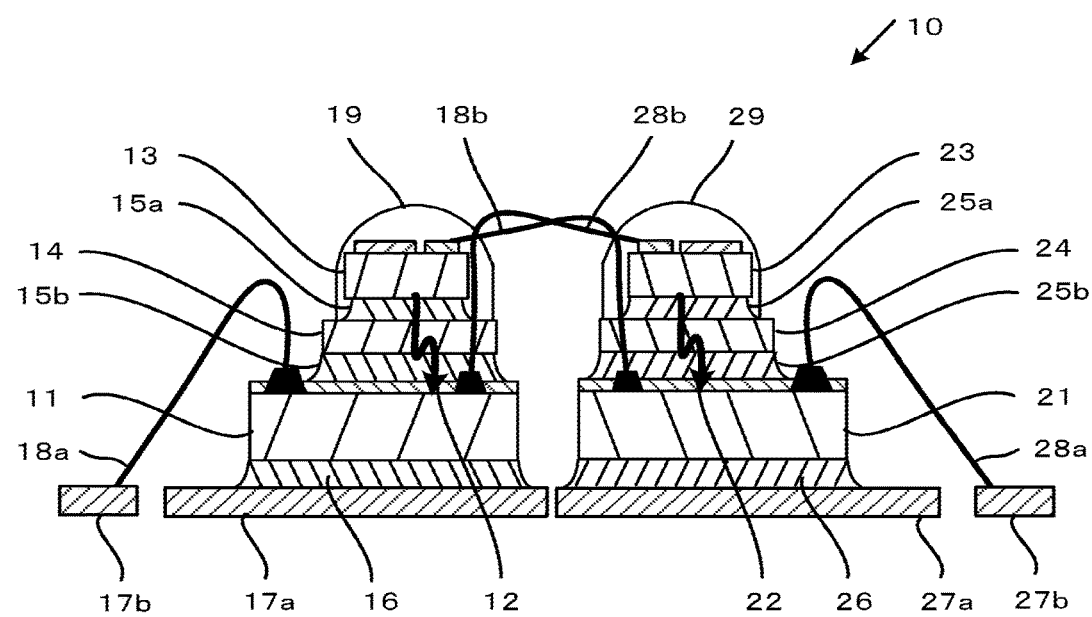
FIG. 1 is a cross-sectional view illustrating a semiconductor module according to a first embodiment.

According to one embodiment, a semiconductor module includes a first semiconductor element, a second semiconductor element, a first light emitting element and a second light emitting element. The first semiconductor element is provided with a first light receiving circuit and a first output circuit. The second semiconductor element is provided with a second light receiving circuit and a second output circuit. The first light emitting element is electrically connected to the second output circuit and mounted on the first semiconductor element such that first light emitted from the first light emitting element is received by the first light receiving circuit. The second light emitting element is electrically connected to the first output circuit and mounted on the second semiconductor element such that second light emitted from the second light emitting element is received by the second light receiving circuit.

Embodiments are hereinafter described with reference to the drawings.

In the drawings, the same reference numerals denote the same or similar portions. The same portions in the drawings are denoted by the same reference numerals, and detailed description thereof is omitted. Description is provided for different portions.

First Embodiment

Figure 2:
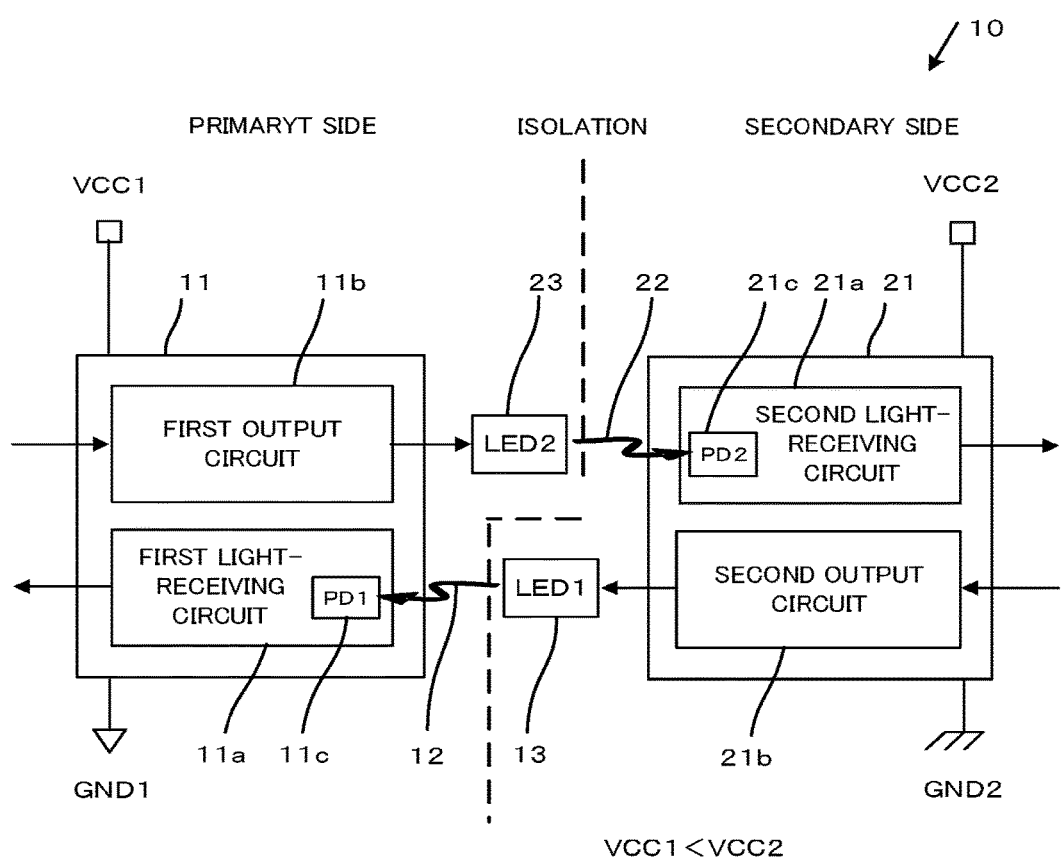
FIG. 2 is a block diagram schematically illustrating a circuit configuration of the semiconductor module according to the first embodiment.
Figure 3A:
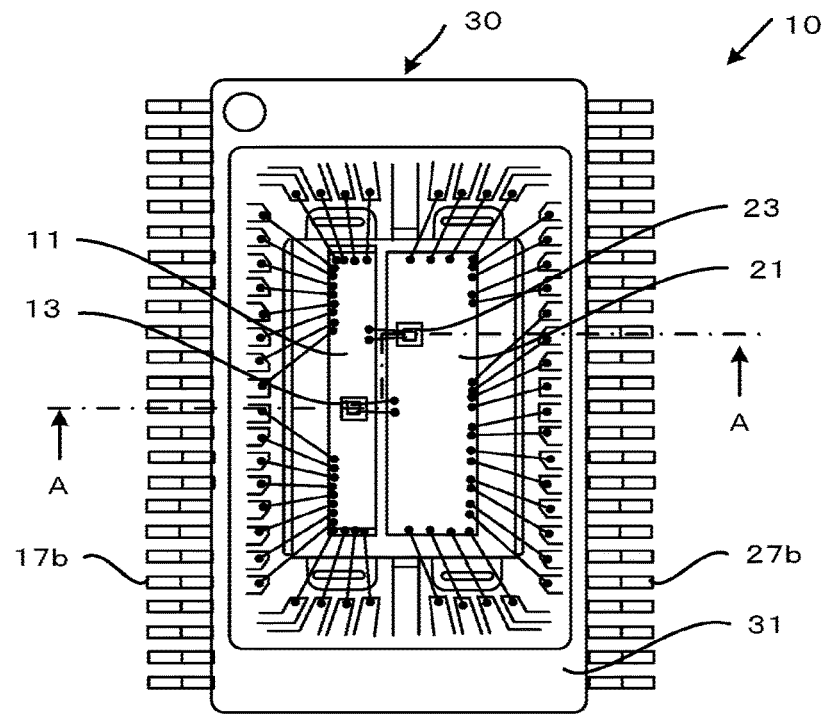
FIGS. 3A and 3B illustrate the semiconductor module as it is housed in a package.
Figure 3B:
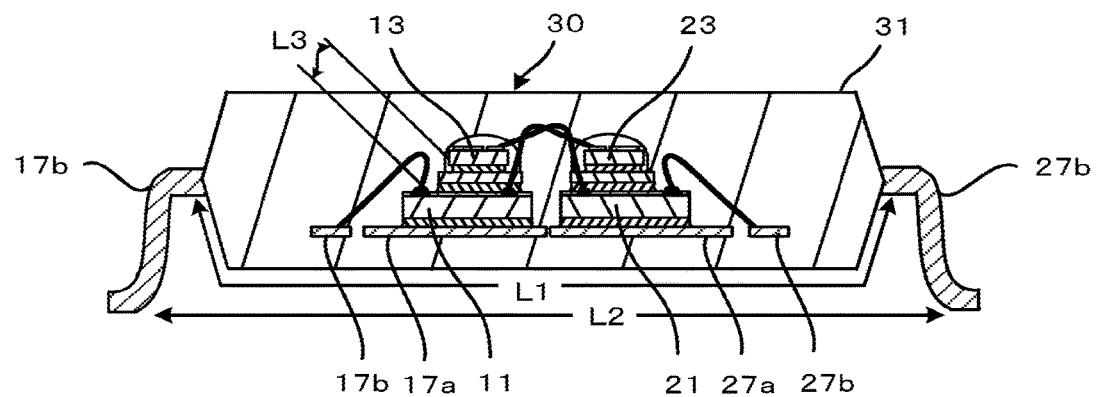

A semiconductor module according to a first embodiment is described with reference to FIGS. 1, 2, 3A, 3B. FIG. 1 is a cross-sectional view illustrating the semiconductor module according to the embodiment. FIG. 2 is a block diagram schematically illustrating a circuit configuration of the semiconductor module. FIGS. 3A, 3B illustrate the semiconductor module as it is housed in a package, FIG. 3A is a plan view thereof, and FIG. 3B is a cross sectional view taken along line A-A and viewed in the direction of the arrows.

The semiconductor module of the embodiment is a gate driver which drives a power semiconductor element such as an insulated gate bipolar transistor (IGBT) or a metal oxide semiconductor field effect transistor (MOSFET) used for an inverter which converts direct current to alternating current.

As illustrated in FIGS. 1, 2, the semiconductor module 10 of the embodiment includes a first semiconductor element 11 provided with a primary circuit operated at a low operating voltage and a second semiconductor element 21 provided with a secondary circuit operated at a high operating voltage.

The first semiconductor element 11 is connected between a power supply having a power supply voltage VCC1 and a reference potential GND1. The second semiconductor element 21 is connected between a power supply having a power supply voltage VCC2 and a reference potential GND2. The power supply voltage VCC2 is higher than the power supply voltage VCC1. The reference potential GND2 is a potential different and electrically insulated from the reference potential GND1.

The first semiconductor element 11 includes a first light receiving circuit 11a and a first output circuit 11b as the primary circuit. The first light receiving circuit 11a includes a photodiode 11c. The second semiconductor element 21 includes a second light receiving circuit 21a and a second output circuit 21b as the second circuit. The second light receiving circuit 21a includes a photodiode 21c.

In addition, the semiconductor module 10 includes a first light emitting element 13 and a second light emitting element 23. The first light emitting element 13 is electrically connected to the second output circuit 21b. The second light emitting element 23 is electrically connected to the first output circuit 11b.

The first light emitting element 13 is mounted on the first semiconductor element 11 such that light (first light) 12 emitted from the first light emitting element 13 is received by the photodiode 11c. The second light emitting element 23 is mounted on the second semiconductor element 21 such that light (second light) 22 emitted from the second light emitting element 23 is received by the photodiode 21c.

Each of the photodiodes 11c and 21c is a silicon photodiode. The first and second light emitting elements 13 and 23 are light emitting diodes (LEDs) which emit an infrared light matched with the light receiving sensitivity of the silicon photodiode.

The first light emitting element 13 is stacked on the first semiconductor element 11 with a first insulator 14 interposed in between, the first insulator 14 being pervious to the first light 12. The second light emitting element 23 is stacked on the second semiconductor element 21 with a second insulator 24 interposed in between, the second insulator 24 being pervious to the second light 22.

Materials having high insulating properties, such as sapphire and quartz glass, are suitable for the first and second insulators 14 and 24. A light-transmissive ceramic may be used for the material.

To be more specific, as illustrated in FIG. 1, bonding resins (first bonding resins) 15a, 15b pervious to the first light 12 are provided, respectively, between the first light emitting element 13 and the first insulator 14 and between the first insulator 14 and the first semiconductor element 11.

In other words, the first light emitting element 13 and the first insulator 14 are bonded together with the bonding resin 15a, and the first insulator 14 and the first semiconductor element 11 are bonded together with the bonding resin 15b.

Similarly, bonding resins (second bonding resins) 25a, 25b pervious to the second light 22 are provided, respectively, between the second light emitting element 23 and the second insulator 24 and between the second insulator 24 and the second semiconductor element 21.

In other words, the second light emitting element 23 and the second insulator 24 are bonded together with the bonding resin 25a, and the second insulator 24 and the second semiconductor element 21 are bonded together with the bonding resin 25b.

Each of the bonding reins 15a, 15b, 25a, 25b is a silicon paste having insulating properties, for example.

The first semiconductor element 11 is joined to a die pad 17a with an electrically conductive adhesive 16. The first semiconductor element 11 is connected to a lead 17b via a wire 18a. The electrically conductive adhesive 16 is a silver paste, a solder, or the like, for example.

Similarly, the second semiconductor element 21 is joined to a die pad 27a with an electrically conductive adhesive 26. The second semiconductor element 21 is connected to a lead 27b via a wire 28a. The electrically conductive adhesive 26 is a silver paste, a solder, or the like, for example.

The first light emitting element 13 is electrically connected to the second output circuit 21b via a wire 18b. The first light emitting element 13 is covered with an inner resin (a first inner resin) 19.

Similarly, the second light emitting element 23 is electrically connected to the first output circuit 11b via a wire 28b. The second light emitting element 23 is covered with an inner resin (a second inner resin) 29.

The inner resins 19, 29 are what is called an encapsulating material to ease the stress to be imposed on the first and second light emitting elements 13 and 23 by an outer resin 31, and the inner resins 19, 29 are silicone resin, for example. The inner resins 19, 29 are soft resins having a low modulus of elasticity than the outer resin 31.

As illustrated in FIGS. 3A, 3B, the semiconductor module 10 further includes a package 30. The package 30 is a resin package of a dual inline package (DIP) type in which leads extend from two opposed sides of the package, for example.

The first and second semiconductor elements 11, 21, the first and second light emitting elements 13, 23, and a portion of a leadframe including the die pads 17a, 27a are integrally covered with the outer resin 31. The leads 17b, 27b extend from two opposed sides of the outer resin 31. The outer resin 31 is a thermosetting resin such as epoxy, for example.

Note that portions of the leads 17b, 27b between where wires are connected and where the leads 17b, 27b extend from the outer resin 31 are omitted in FIGS. 3A, 3B.

As illustrated in FIG. 2, the first output circuit 11b processes an input signal from outside and outputs the processing result to the second light emitting element 23. The second light emitting element 23 emits the second light 22 in accordance with the processing result. The second light receiving circuit 21a detects the second light 22 with the photodiode 21c, processes the detection result (photocurrent), and outputs the processing result to outside.

Similarly, the second output circuit 21b processes an input signal from outside and outputs the processing result to the first light emitting element 13. The first light emitting element 13 emits the first light 12 in accordance with the processing result. The first light receiving circuit 11a detects the first light 12 with the photodiode 11c, processes the detection result (photocurrent), and outputs the processing result to outside.

Thus, a signal is transmitted from the primary circuit to the secondary circuit by the optical coupling, and a signal is transmitted from the secondary circuit to the primary circuit by the optical coupling. The signal transmission from the primary circuit to the secondary circuit and the signal transmission from the secondary circuit to the primary circuit are electrically insulated and performed independently.

Next, specific examples of the first and second semiconductor elements 11, 21 and the first and second light emitting elements 13, 23 are described with reference to FIGS. 4 to 6.

Figure 4:
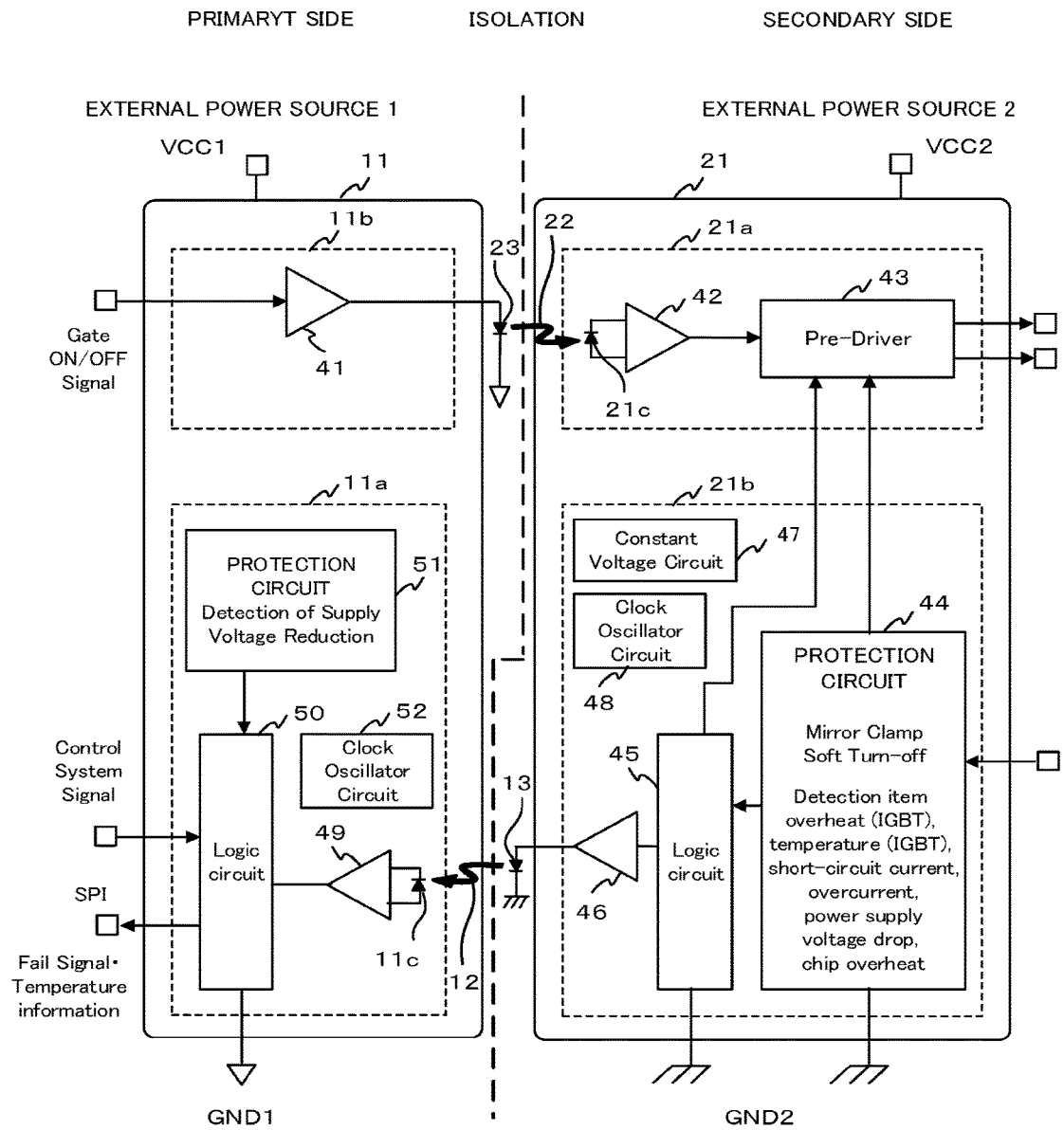
FIG. 4 is a block diagram illustrating details of the circuit configuration of the semiconductor module according to the first embodiment.

FIG. 4 is a block diagram illustrating details of the circuit configurations of the first and second semiconductor elements 11, 21. FIG. 5 is a block diagram illustrating a drive circuit for a power semiconductor element using the semiconductor module 10. FIG. 6 is a cross-sectional view illustrating the first and second light emitting elements 13, 23.

As illustrated in FIG. 4, the first output circuit 11b includes an amplifier 41. The amplifier 41 amplifies a signal to turn on and off a gate and outputs the amplified signal to the second light emitting element 23.

The second light receiving circuit 21a includes an amplifier 42 and a pre-driver 43. The amplifier 42 amplifies a photocurrent and outputs the amplified photocurrent to the pre-driver 43. The pre-driver 43 converts the output of the amplifier 42 to a gate drive signal for the power semiconductor element and outputs the gate drive signal to a driver, which is described later.

The second output circuit 21b includes a protection circuit 44, a logic circuit 45, an amplifier 46, a constant voltage circuit 47, and a clock oscillator circuit 48.

The protection circuit 44 processes signals from various sensors which detect operating conditions of the power semiconductor element. When a detection value exceeds a reference value, the protection circuit 44 outputs a signal to limit the operation of the pre-driver 43 to the pre-driver 43. In addition, the protection circuit 44 converts the processing results into digital values and outputs the digital values to the logic circuit 45.

The detection items by the various sensors include overheat detection, temperature detection, short circuit current detection, and overcurrent detection of the power semiconductor element, drop detection of the power supply voltage VCC2, chip overheat detection of the second semiconductor element 21, and the like, for example.

The logic circuit 45 outputs to the pre-driver 43 a signal to control the operation of the pre-driver 43 in accordance with the processing result, and also outputs the processing result to the amplifier 46. The amplifier 46 amplifies a signal indicating the processing result and outputs the amplified signal to the first light emitting element 13.

The constant voltage circuit 47 supplies the protection circuit 44 with a reference voltage as a reference value. The clock oscillator circuit 48 supplies the logic circuit 45 with a clock signal.

The first light receiving circuit 11a includes an amplifier 49, a logic circuit 50, a protection circuit 51, and a clock oscillator circuit 52. The amplifier 49 amplifies a photocurrent and outputs the amplified photocurrent to the logic circuit 50.

The protection circuit 51 detects a drop of the power supply voltage VCC1. When detecting that the power supply voltage VCC1 falls below a reference value, the protection circuit 51 outputs to the logic circuit 50 an instruction to perform a protection operation to save data into a nonvolatile memory or to do the like, for example.

The logic circuit 50 exchanges a control signal, a fail signal, temperature information, and others with a host in accordance with the processing results of the logic circuit 45, for example. The clock oscillator circuit 52 supplies the logic circuit 50 with a clock signal.

Figure 5:
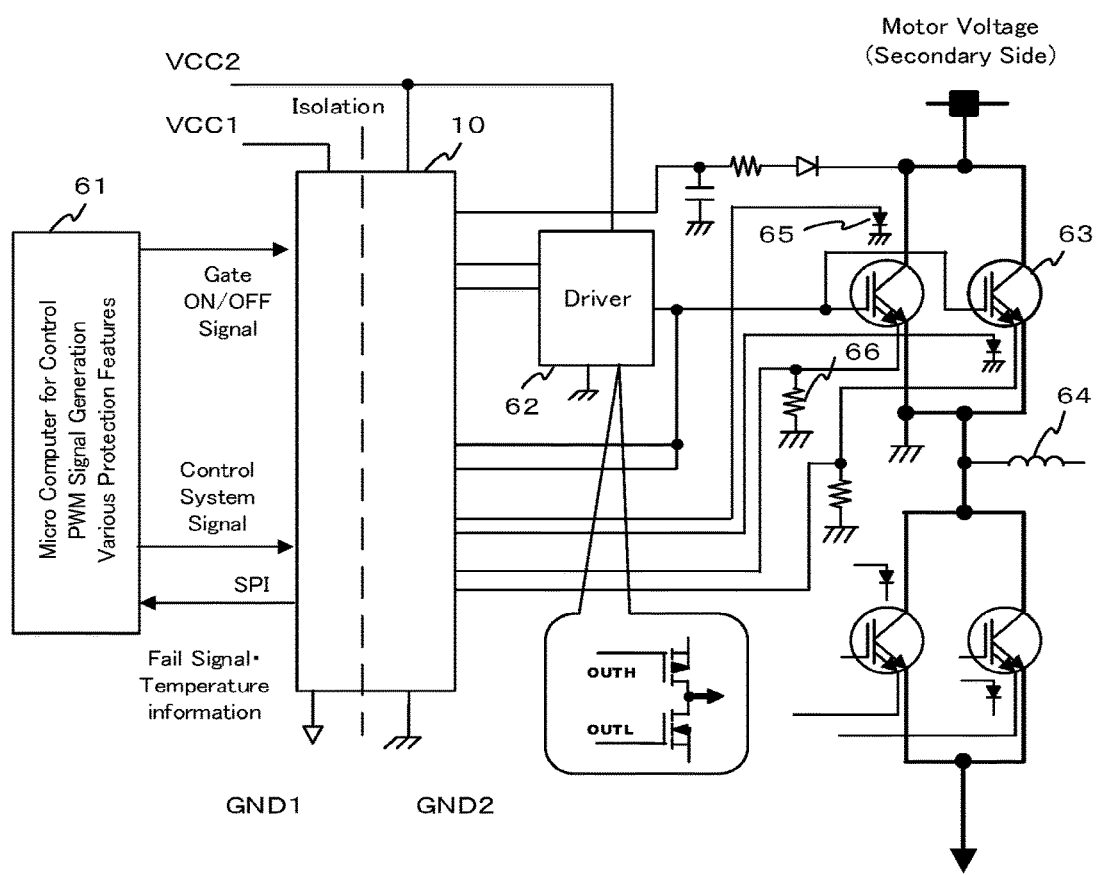
FIG. 5 is a block diagram illustrating a drive circuit for a power semiconductor element using the semiconductor module according to the first embodiment.

As illustrated in FIG. 5, the semiconductor module 10 is used as a gate driver for a power semiconductor element which drives a three-phase motor (not illustrated). Note that FIG. 5 illustrates a portion of the semiconductor module 10 only for one of the three phases.

In the semiconductor module 10, the first semiconductor element 11 is connected to a microcomputer 61 for controlling the three-phase motor, and the second semiconductor element 21 is connected to an IGBT (a power semiconductor element) 63 via an external driver 62. The IGBT 63 is connected to a stator coil 64.

The reason the driver 62 is an external driver is that a specification required for the driver 62 is different depending on the IGBT 63 to be used. This gives the semiconductor module 10 versatility.

Note that the IGBT 63 may be IGBTs connected in parallel depending on the current capacity of the application. A diode 65 functions as a sensor which detects overheat of the IGBT 63. A resistor 66 functions as a sensor which detects overcurrent and short circuit current of the IGBT 63.

The power supply voltage VCC1 is 5 V, for example. The power supply voltage VCC2 is 30 V, for example. The voltage (at the secondary side) of the three-phase motor is from 600 V to 1200 V, for example.

In order to secure a withstand voltage conforming to the safety regulation (IEC60950) specified in the Japanese Industrial Standards (JIS) in view of the safety, it is preferable that the package 30 illustrated in FIGS. 3A and 3B have an outer creepage distance L1 of 5 mm or more and a clearance L2 of 5 mm or more. Further, it is preferable that the outer creepage distance L1 is equal to the clearance L2.

The outer creepage distance is a distance along the bottom surface and the lower portions of side surfaces of the outer resin 31 between the leads 17b, 27b extending at the opposite sides. The clearance is a distance on a straight line between the leads 17b, 27b extending at the opposite sides.

In addition, in order to secure a withstand voltage of 3.75 kV, it is preferable that an inner creepage distance L3 of the first light emitting element 13 be 1.2 mm or more. The inner creepage distance is the shortest distance from the first light emitting element 13 to a bonding pad of the first semiconductor element 11 via top and side surfaces of the first insulator (thing) 14, and a top surface of the first semiconductor element 11.

Figure 6:
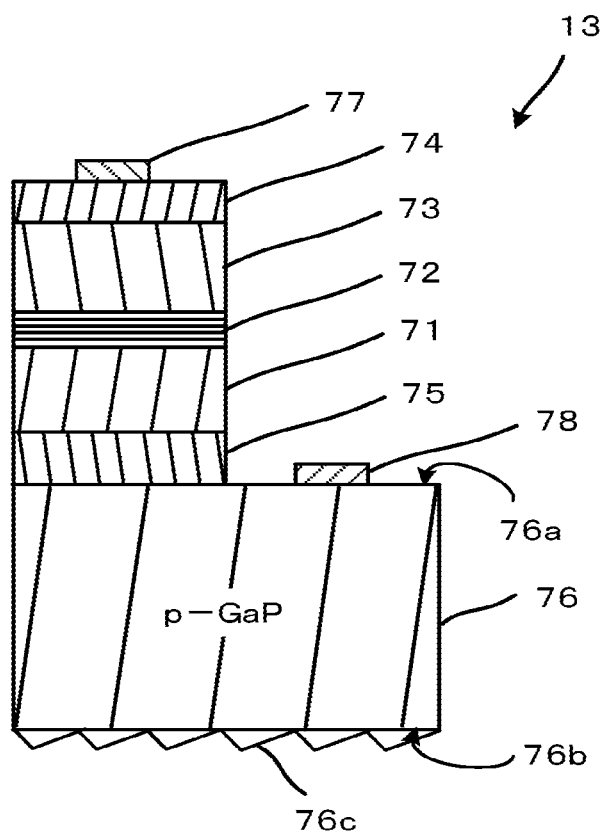
FIG. 6 is a cross-sectional view illustrating a light emitting element used in the semiconductor module according to the first embodiment.

As illustrated in FIG. 6, the first light emitting element 13 has a p-InGaAlP cladding layer 71, an InGaAlAs/GaAlAs multiple quantum well (MQW) active layer 72, an n-InGaAlP cladding layer 73, and an n-GaAs contact layer 74, which are stacked in this order.

The p-cladding layer 71 side is bonded to a first surface 76a of a p-GaP support substrate 76 with a p-InGaP bonding layer 75. An n-electrode 77 is provided on the n-contact layer 74, and a p-electrode 78 is provided on the first surface 76a of the p-support substrate 76.

A light emitting diode having an InGaAlAs/GaAlAs MQW active layer is capable of emitting near-infrared light with a wavelength of about 770 nm.

The p-support substrate 76 has a second surface 76b, which is a primary surface to emit light. It is preferable to provide asperities 76c on the second surface 76b. Surface roughening on the light emitting surface improves the light extraction efficiency.

The first light emitting element 13 is mounted on the first semiconductor element 11 such that the second surface 76b, which is a light emitting surface, faces a light receiving surface of the photodiode 11c. The same applies to the second light emitting element 23, and description thereof is omitted.

Figure 7:
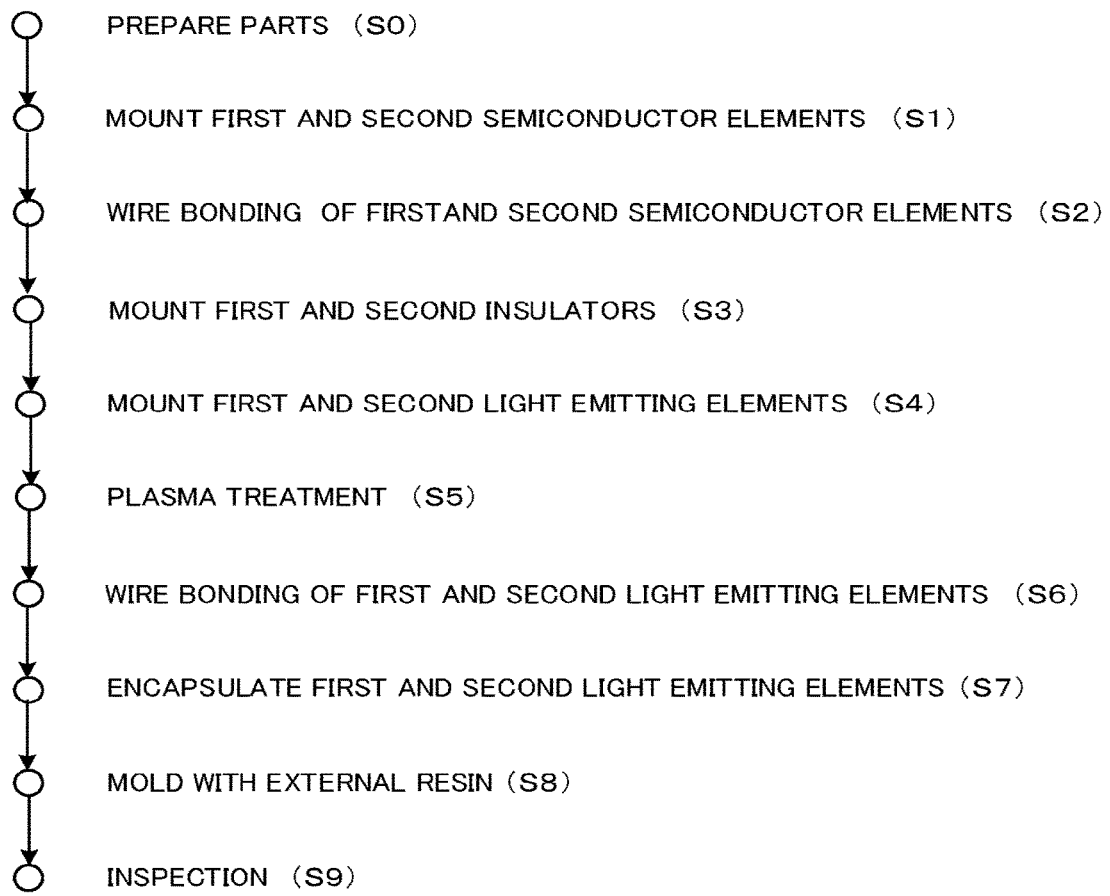
FIG. 7 is a flowchart illustrating an assembly process of the semiconductor module according to the first embodiment.
Figure 8A:
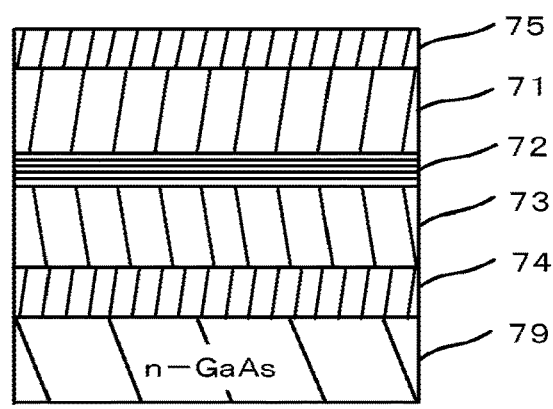
FIGS. 8A to 8C are cross-sectional views illustrating a sequence of a manufacturing process of the light emitting element used in the semiconductor module according to the first embodiment.
Figure 8B:
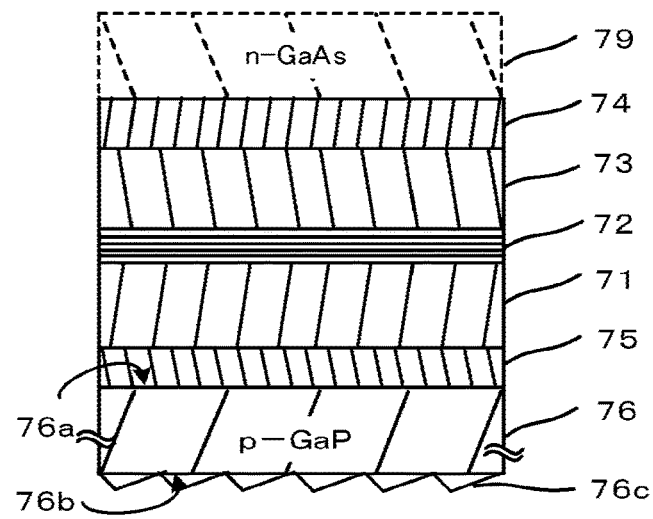
Figure 8C:
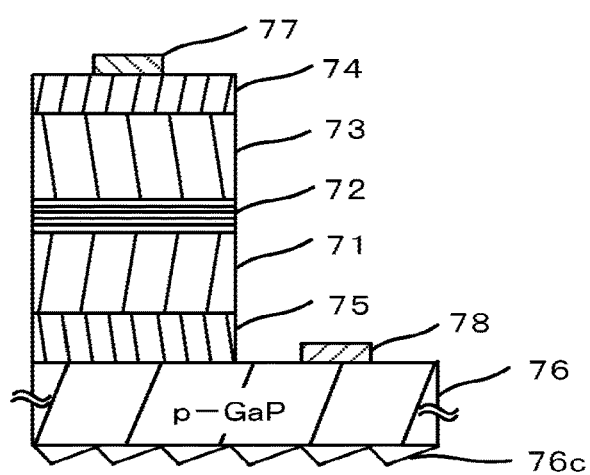

A description is given of a manufacturing method of the semiconductor module 10 with reference to FIG. 7 and FIGS. 8A to 8C. FIG. 7 is a flowchart illustrating an assembly process of the semiconductor module 10. FIGS. 8A to 8C are cross-sectional views illustrating a sequence of a manufacturing process of the first and second light emitting elements 13 and 23.

As illustrated in FIG. 7, parts such as the first and second semiconductor elements 11, 21, the first and second light emitting elements 13 and 23, the first and second insulators 14 and 24, and the leadframe (S0) are prepared.

The first semiconductor element 11 is mounted on the die pad 17a of the leadframe with silver paste interposed in between; the second semiconductor element 21 is mounted on the die pad 27a of the leadframe with silver paste interposed in between (S1). The first semiconductor element 11 and the lead 17b of the leadframe are connected to each other by wire bonding; the second semiconductor element 21 and the lead 27b of the leadframe are connected to each other by wire bonding (S2).

The first insulator 14 is mounted on the first semiconductor element 11 with the bonding resin 15b interposed in between; the second insulator 24 is mounted on the second semiconductor element 21 with the bonding resin 25b interposed in between (S3).

The first light emitting element 13 is mounted on the first insulator 14 with the bonding resin 15a interposed in between; the second light emitting element 23 is mounted on the second insulator 24 with the bonding resin 25a interposed in between (S4). Surfaces of the first and second light emitting elements 13 and 23 are cleaned by plasma treatment (S5).

The first light emitting element 13 and a pad of the second semiconductor element 21 are electrically connected to each other by wire bonding; the second light emitting element 23 and a pad of the first semiconductor element 11 are electrically connected to each other by wire bonding (S6). Each of the first and second light emitting elements 13, 23 is encapsulated with silicone resin or the like (S7).

The first and second semiconductor elements 11, 21, the first and second light emitting elements 13, 23, and a portion of the leadframe, the portion including the die pads 17a, 27a, are sealed by molding with epoxy resin or the like (S8). Lastly, appearances and characteristics are inspected (S9). Thus, the semiconductor module 10 is completed.

As described in FIG. 8A, the n-contact layer 74, the n-cladding layer 73, the active layer 72, the p-cladding layer 71, and the p-bonding layer 75 are epitaxially grown on an n-GaAs substrate 79 by metal organic chemical vapor deposition (MOCVD) in this order. The n-GaAs substrate 79 is a substrate for epitaxial growth. GaAs is lattice-matched with InGaAlP-based semiconductors. The n-contact layer 74, the n-cladding layer 73, the active layer 72, the p-cladding layer 71, and the p-bonding layer 75 are collectively called an epitaxial layer below.

As illustrated in FIG. 8B, the substrate 79 on which the epitaxial layer is formed is inverted. The p-bonding layer 75 and the p-support substrate 76 are put on top of each other and subjected to heat treatment. The p-bonding layer 75 and the p-support substrate 76 are directly joined. After that, the substrate 79 is removed by wet etching.

Note that it is preferable to form the asperities 76c on the p-support substrate 76 in advance. The asperities 76c can be formed by wet etching using a selective etchant, by wet etching or dry etching using a patterned mask, or by grinding using coarse abrasive grains, for example.

As illustrated in FIG. 8C, a resist film (not illustrated) is formed on a portion of the epitaxial layer by photolithography. Using the resist film as a mask, a portion of the epitaxial layer is removed by reactive ion etching (RIE) to expose a portion of the p-support substrate 76. An n-side electrode 77 is formed on a remaining portion of the n-contact layer 74, and a p-side electrode 78 is formed on the exposed portion of the p-support substrate 76.

The p-support substrate 76 is divided into chips. Thus, the first and second light emitting elements 13, 23 are obtained.

As described above, the semiconductor module 10 according to the embodiment includes the first semiconductor element 11 provided with the first light receiving circuit 11a and the first output circuit 11b, the second semiconductor element 21 provided with the second light receiving circuit 21a and the second output circuit 21b, the first light emitting element 13 electrically connected to the second output circuit 21b and mounted on the first semiconductor element 11 such that the first light 12 emitted from the first light emitting element 13 is received by the first light receiving circuit 11a, and the second light emitting element 23 electrically connected to the first output circuit 11b and mounted on the second semiconductor element 21 such that the second light 22 emitted from the second light emitting element 23 is received by the second light receiving circuit 21a.

This enables the first semiconductor element 11 and the second semiconductor element 21, each having a different operating voltage, to transmit/receive signals to/from each other while maintaining the withstand voltage therebetween. Thus, the small semiconductor module incorporating the insulating elements can be obtained.

Figure 9:
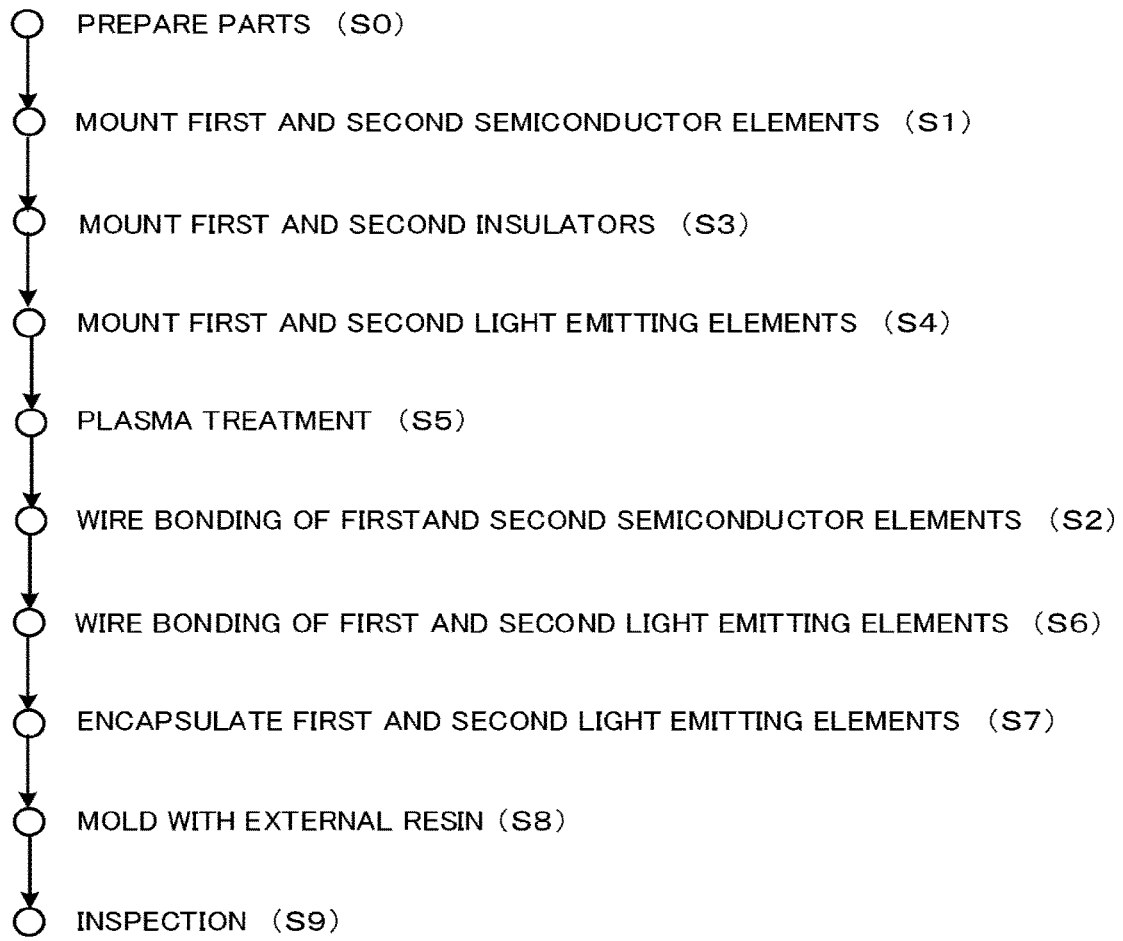
FIG. 9 is a flowchart illustrating another assembly process of the semiconductor module according to the first embodiment.

Note that the assembly process of the semiconductor module 10 is not limited to the flowchart illustrated in FIG. 7 and may follow another flowchart. FIG. 9 is a flowchart illustrating another assembly process.

In the flowchart in FIG. 9, the order of the mounting steps (S1, S3, S4) and the wire bonding steps (S2, S6) is changed. The order of the other steps is not changed.

To be more specific, first the mounting steps (S1, S3, S4) are performed in series, and after that, the wire bonding steps (S2, S6) are performed in series.

Second Embodiment

Figure 10:
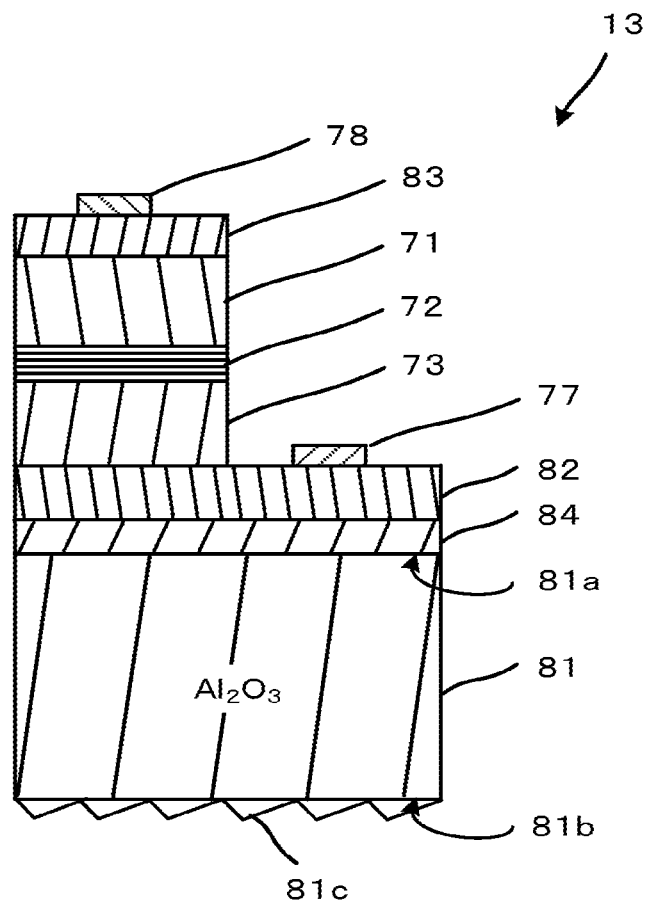
FIG. 10 is a cross-sectional view illustrating a light emitting element used in a semiconductor module according to a second embodiment.

A semiconductor module according to a second embodiment is described with reference to FIG. 10. FIG. 10 is a cross-sectional view illustrating a light emitting element used in the semiconductor module according to the embodiment.

In the embodiment, portions constituting the same portions in the above first embodiment are denoted by the same reference numerals, and description thereof is omitted. Description is provided for different portions. A different point of the embodiment from the first embodiment is that a support substrate of a light emitting element is made of insulating material. Since a first light emitting element 13 and a second light emitting element 23 have the same configuration, description is provided only for the first light emitting element 13 hereinafter.

More specifically, the first light emitting element 13 illustrated in FIG. 6 has the support substrate 76, which is a p-GaP substrate having electrical conductivity, whereas the first light emitting element 13 in the semiconductor module of the embodiment has a sapphire substrate having an insulating property as a support substrate 81 as illustrated in FIG. 10.

The first light emitting element 13 has an n-InGaP contact layer 82, an n-InGaAlP cladding layer 73, an InGaAlAs/GaAlAs MQW active layer 72, a p-InGaAlP cladding layer 71, and a p-GaAs contact layer 83, which are stacked in this order.

The n-InGaP contact layer 82 side is bonded to a first surface 81a of the insulating support substrate 81 with an InAlP or InGaAlP bonding layer 84. A p-electrode 78 is provided on the p-contact layer 83, and an n-electrode 77 is provided on an exposed surface of the n-contact layer 82.

In order to improve the light extraction efficiency, it is preferable to provide asperities 81c on a second surface 81b of the insulating support substrate 81. The asperities 81c can be formed by dry etching using a patterned mask or by grinding using coarse abrasive grains, for example.

In the semiconductor module according to the embodiment, the first light emitting element 13 has the insulating support substrate 81. When the inner creepage distance L3 is the same, the withstand voltage of the semiconductor module of the embodiment can be improved as compared to the semiconductor module which uses the first light emitting element 13 having the electrically conductive p-support substrate 76. This makes it possible to increase a margin for the withstand voltage.

On the other hand, when the withstand voltage is the same, the inner creepage distance L3 can be reduced. This makes it possible to further downsize the semiconductor module.

Moreover, the insulating support substrate 81 may be adapted to also serve as the first insulator 14. In this case, the insulating support substrate 81 may be made a little thicker than the first insulator 14 and/or a little larger than the first insulator 14. This is a suitable configuration for a case where there is a margin for the withstand voltage.

This configuration eliminates the first insulator 14, reducing the part count, and at the same time, making it possible to further downsize the semiconductor module.

As described above, in the semiconductor module according to the embodiment, each of the first and second light emitting elements 13 and 23 has the insulating support substrate 81. As a result, it is possible to improve the withstand voltage and further downsize the semiconductor module.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor module comprising:
    a first semiconductor element provided with a first light receiving circuit and a first output circuit, the first semiconductor element connecting a first supply voltage;
    a second semiconductor element provided with a second light receiving circuit and a second output circuit, the second semiconductor element connecting a second supply voltage;
    a first light emitting element electrically connected to the second output circuit and mounted on the first semiconductor element such that first light emitted from the first light emitting element is received by the first light receiving circuit;
    a second light emitting element electrically connected to the first output circuit and mounted on the second semiconductor element such that second light emitted from the second light emitting element is received by the second light receiving circuit;
    a first insulator interposed between the first semiconductor element and the first light emitting element, the first insulator being pervious to the first light; and
    a second insulator interposed between the second semiconductor element and the second light emitting element, the second insulator being pervious to the second light,
    wherein the second supply voltage is higher than the first supply voltage.

2. The semiconductor module according to claim 1, further comprising;
    an inner resin to cover each of the first and second light emitting elements; and
    an outer resin to cover each of the first and second semiconductor elements and the first and second light emitting elements, the outer resin having a higher modulus of elasticity than the inner resin.

3. The semiconductor module according to claim 1, wherein an operating voltage of the first semiconductor element and an operating voltage of the second semiconductor element are different.

4. The semiconductor module according to claim 1, wherein the first and second insulators are made of any of sapphire, quarts glass, and light transmissive ceramic.

5. A semiconductor module comprising:
    a semiconductor element provided with a light receiving circuit and an output circuit, the semiconductor element connecting a supply voltage;
    a light emitting element electrically connected to the output circuit and mounted on the semiconductor element such that light emitted from the light emitting element is received by the light receiving circuit;
    an insulator provided between the semiconductor element and the light emitting element, the insulator being pervious to the light.

6. The semiconductor module according to claim 5, further comprising:
    an inner resin to cover the light emitting element; and
    an outer resin to integrally cover the semiconductor element and the light emitting element, the outer resin having a higher modulus of elasticity than the inner resin.

7. The semiconductor module according to claim 5, wherein the insulator is made of any sapphire, quarts glass, and light-transmissive ceramic.

* * * * *